(12) United States Patent  (10) Patent No.:  US 8,487,292 B2
Sekar et al.  (45) Date of Patent:  Jul. 16, 2013

(54) RESISTANCE-SWITCHING MEMORY CELL WITH HEAVILY DOPED METAL OXIDE LAYER

(75) Inventors: Deepak C. Sekar, San Jose, CA (US); Franz Kreupl, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 168 days.

(21) Appl. No.: 12/842,798

(22) Filed: Jul. 23, 2010

(65) Prior Publication Data

US 2011/0227024 A1  Sep. 22, 2011

Related U.S. Application Data

(60) Provisional application No. 61/314,564, filed on Mar. 16, 2010.

(51) Int. Cl.
*H01L 47/00*  (2006.01)

(52) U.S. Cl.
USPC ....... 257/4; 257/2; 257/43; 365/148; 365/218

(58) Field of Classification Search
USPC ................ 257/2, 4, 43, E29.326, E21.004, 257/E21.363; 438/104; 365/148, 218
See application file for complete search history.

(56) References Cited

U.S. PATENT DOCUMENTS

| | | | |
|---|---|---|---|
| 3,796,926 A | 3/1974 | Cole et al. | |
| 6,815,744 B1 | 11/2004 | Beck et al. | |
| 2002/0035035 A1* | 3/2002 | Kirchnerova et al. | 502/324 |
| 2006/0189077 A1 | 8/2006 | Herner et al. | |
| 2006/0250836 A1* | 11/2006 | Herner et al. | 365/148 |
| 2007/0114508 A1 | 5/2007 | Herner et al. | |
| 2007/0228354 A1 | 10/2007 | Scheuerlein | |
| 2008/0233288 A1 | 9/2008 | Clark | |
| 2009/0020752 A1* | 1/2009 | Chen et al. | 257/43 |
| 2009/0026434 A1 | 1/2009 | Malhotra et al. | |
| 2009/0272959 A1 | 11/2009 | Phatak et al. | |
| 2009/0272961 A1 | 11/2009 | Miller et al. | |
| 2009/0272962 A1 | 11/2009 | Kumar et al. | |
| 2009/0278109 A1 | 11/2009 | Phatak | |
| 2010/0157710 A1* | 6/2010 | Lambertson et al. | 365/218 |

OTHER PUBLICATIONS

Tetragonal Phase Stabilization by Doping as an Enabler of Thermally Stable HfO2 based MIM and MIS Capacitors for sub 50nm Deep Trench DRAM; Electron Devices Meeting, 2006. IEDM '06. International; Dec. 11-13, 2006; pp. 1-4.*

(Continued)

*Primary Examiner* — A. Sefer
*Assistant Examiner* — Farid Khan
(74) *Attorney, Agent, or Firm* — Vierra Magen Marcus LLP

(57) ABSTRACT

A non-volatile resistance-switching memory element includes a resistance-switching element formed from a metal oxide layer having a dopant which is provided at a relatively high concentration such as 10% or greater. Further, the dopant is a cation having a relatively large ionic radius such as 70 picometers or greater, such as Magnesium, Chromium, Calcium, Scandium or Yttrium. A cubic fluorite phase lattice may be formed in the metal oxide even at room temperature so that switching power may be reduced. The memory element may be pillar-shaped, extending between first and second electrodes and being in series with a steering element such as a diode. The metal oxide layer may be deposited at the same time as the dopant. Or, using atomic layer deposition, an oxide of a first metal can be deposited, followed by an oxide of a second metal, followed by annealing to cause intermixing, in repeated cycles.

20 Claims, 9 Drawing Sheets

OTHER PUBLICATIONS

Gao, et al "Oxide-Based RRAM: Uniformity Improvement Using a New Material-Oriented Methodology", 2009 Symposium on VLSI Technology Digest of Technical Papers, Jun. 16-18, 2009, 2B-4, pp. 30-31.

Guan, et al., "Nonvolatile Resistive Switching Characteristics of HfO2 with Cu Doping", Mater. Res. Soc. Symp. Proc. vol. 1071, 2008 Materials Research Society, 1071-F07-08, Mar. 24-27, 2008.

Lee, et al., "Enthalpy of Formation of the Cubic Fluorite Phase in the Ceria-Zirconia System", J. Mater. Res., vol. 23, No. 4, Apr. 2008, Materials Research Society, pp. 1105-1112.

Roginskaya, et al., "Characterization of Bulk and Surface Composition of CoxNi1-xOy Mixed Oxides for Electrocatalysis", Abstract, American Chemical Society, Aug. 20, 1997.

Sim, et al., "Resistance-Switching Characteristics of Polycrystalline Nb2O5 for Nonvolatile Memory Application", IEEE, Electron Devices Meeting, 2005, IEEE Electron Devices Letters, vol. 26, No. 5, May 2005, pp. 292-294.

Tang, et al.. "Martensitic Phase Transformation of Isolated HfO2, ZrO2, and HfxZr1-xO2 (0<x<1) Nanocrystals", Adv. Funct. Mater, vol. 15, 2005, pp. 1595-1602.

Tharayil, "Optical, Electrical and Structural Studies of Nickel-Cobalt Oxide Nanoparticles", Indian Journal of Engineering & Materials Sciences, vol. 15, Dec. 2008, pp. 489-496.

\* cited by examiner

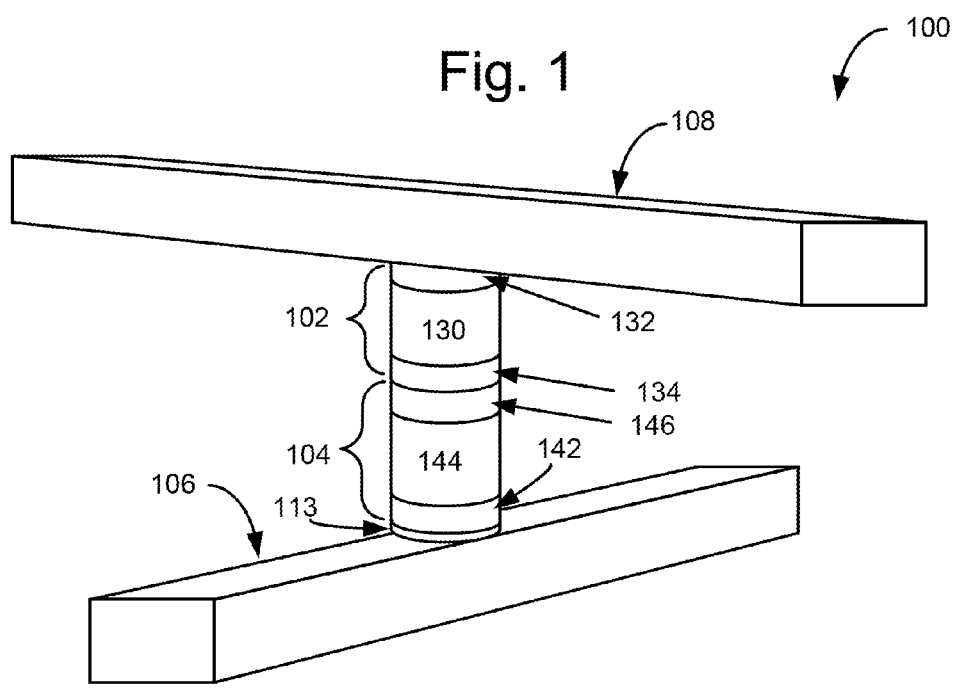
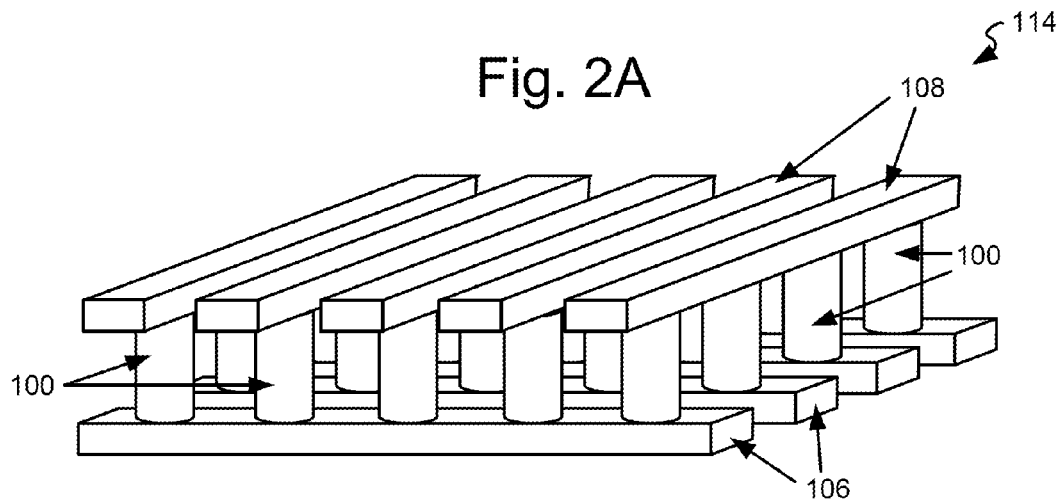

or TiOx, C or Ti

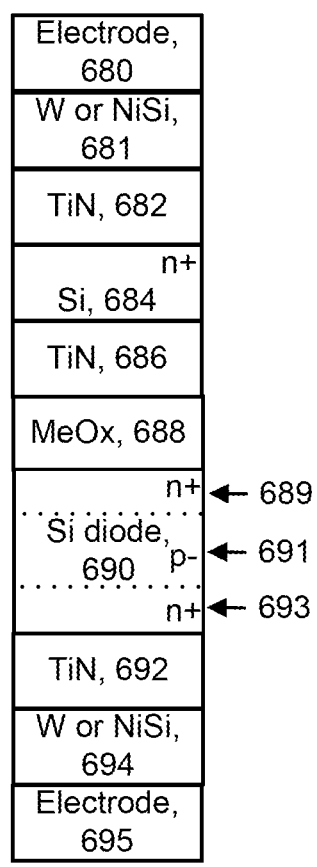

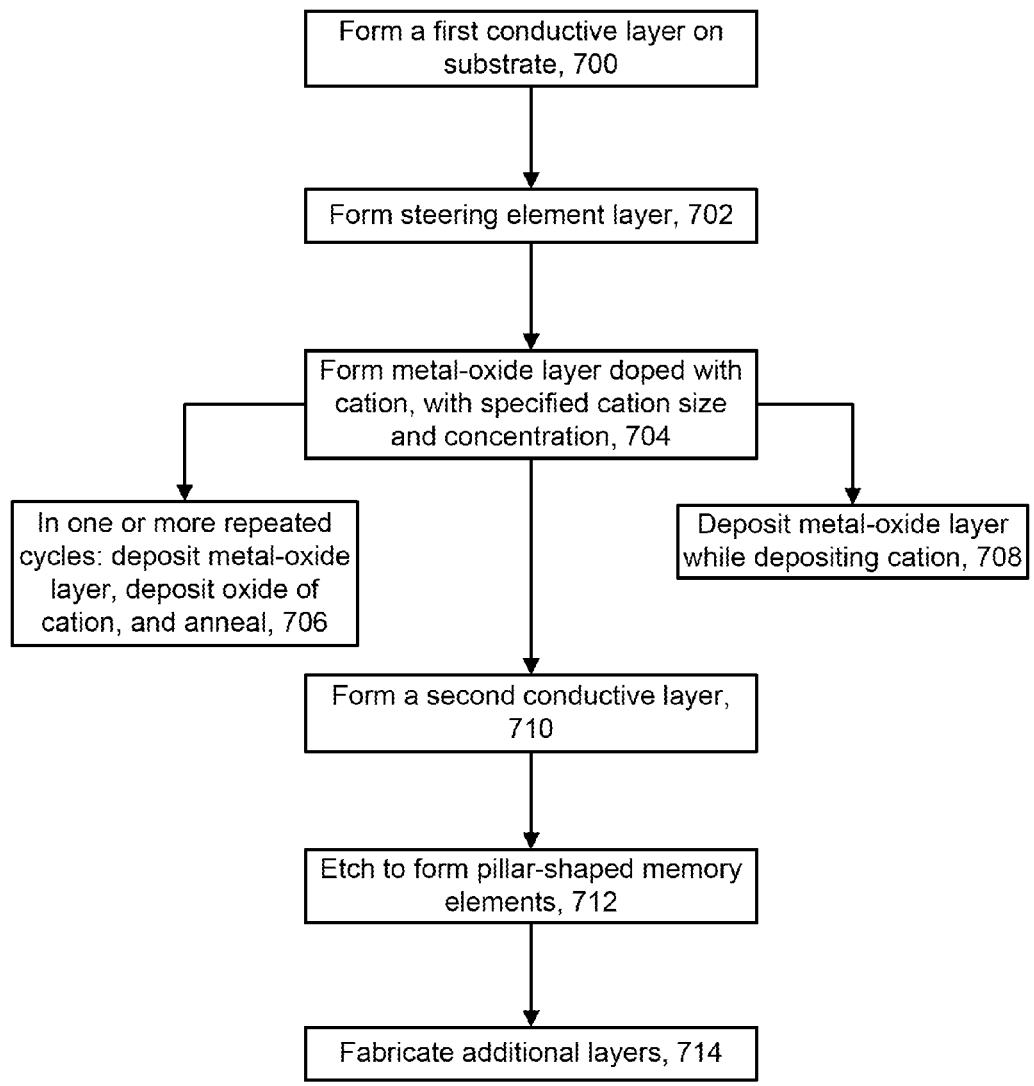

RESISTANCE-SWITCHING MEMORY CELL WITH HEAVILY DOPED METAL OXIDE LAYER

CROSS-REFERENCE TO RELATED APPLICATIONS

This application claims the benefit of U.S. provisional patent application no. 61/314,564, filed Mar. 16, 2010, titled "Non-volatile storage with metal oxide switching element," to Franz Kreupl et al., incorporated herein by reference.

BACKGROUND

This disclosure relates to technology for data storage.

A variety of materials show reversible resistance-switching behavior. These materials include chalcogenides, carbon polymers, perovskites, and certain metal oxides (MeOx) and nitrides. Specifically, there are metal oxides and nitrides which include only one metal and exhibit reliable resistance switching behavior. This group includes, for example, Nickel Oxide (NiO), Niobium Oxide ($Nb_2O_5$), Titanium Dioxide ($TiO_2$), Hafnium Oxide ($HfO_2$) Aluminum Oxide ($Al_2O_3$), Magnesium Oxide ($MgO_x$), Chromium Dioxide ($CrO_2$), Vanadium Oxide (VO), Boron Nitride (BN), and Aluminum Nitride (AlN), as described by Pagnia and Sotnick in "Bistable Switching in Electroformed Metal-Insulator-Metal Device," Phys. Stat. Sol. (A) 108, 11-65 (1988). A resistance-switching layer of one of these materials may be formed in an initial state, for example a relatively low-resistance state. Upon application of sufficient voltage, the material switches to a stable high-resistance state. This resistance switching is reversible such that subsequent application of an appropriate current or voltage can serve to return the resistance-switching material to a stable low-resistance state. This conversion can be repeated many times. For some materials, the initial state is high-resistance rather than low-resistance. A set process may refer to switching the material from high to low resistance, while a reset process may refer to switching the material from low to high resistance.

These reversible resistance-switching materials are of interest for use in nonvolatile memory arrays. One resistance state may correspond to a data "0," for example, while the other resistance state corresponds to a data "1." Some of these materials may have more than two stable resistance states.

Non-volatile memories that have storage elements or cells formed from reversible resistance-switching material are known. For example, U.S. Patent Application Publication 2006/0250836, filed May 9, 2005 and titled "Rewriteable Memory Cell Comprising A Diode And A Resistance-Switching Material," incorporated herein by reference, describes a rewriteable non-volatile memory cell that includes a diode coupled in series with a reversible resistance-switching material such as a metal oxide or metal nitride.

There is a continuing need to improve performance in these and other memory devices, including reducing power consumption and increasing reliability.

BRIEF DESCRIPTION OF THE DRAWINGS

FIG. 1 is a simplified perspective view of one embodiment of a memory cell with a reversible resistance-switching element.

FIG. 2A is a simplified perspective view of a portion of a first memory level formed from a plurality of the memory cells of FIG. 1.

FIG. 6E depicts an example implementation of a layered memory device, where a punch-through diode is used as a steering element.

FIG. 7 depicts an example method for fabricating a set of non-volatile resistance-switching memory elements.

DETAILED DESCRIPTION

Figure 2B:
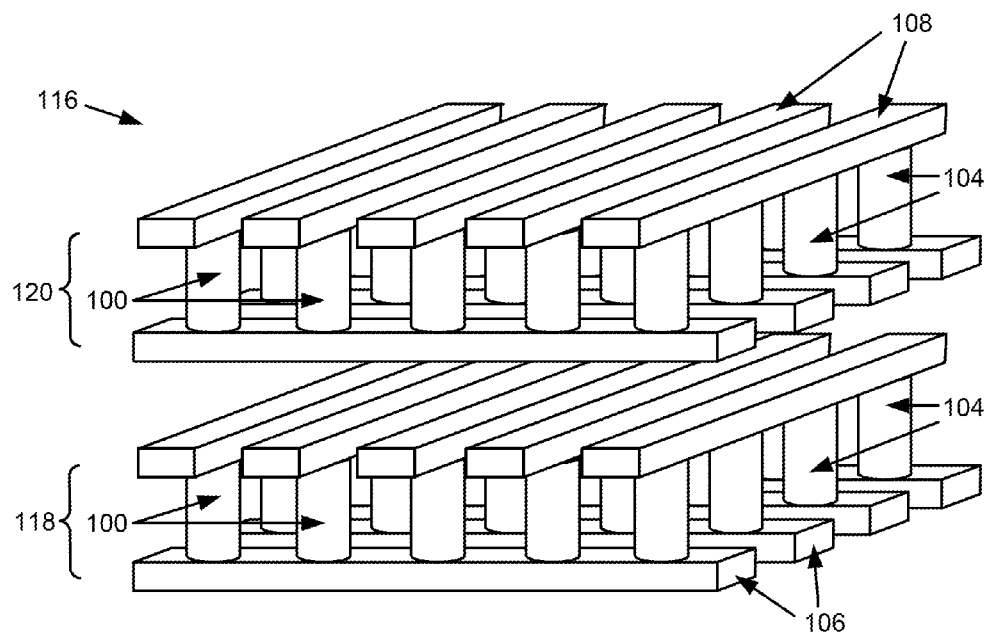
FIG. 2B is a simplified perspective view of a portion of a three dimensional memory array formed from a plurality of the memory cells of FIG. 1.

In a resistance-switching memory element such as a resistance-switching RAM (RRAM), it is expected that improvements in switching power and reliability can be achieved by introducing oxygen vacancies into a metal oxide resistance-switching material. To this end, the metal oxide is doped with a relatively large cation at a relatively high concentration. This doping is believed to induce a phase transition in the crystal orientation of the metal oxide.

In a resistance-switching memory element, a low resistance state is formed when a conductive filament made up of oxygen vacancies is formed through the resistance-switching memory element. A high resistance state is formed when the conductive filament is broken due to oxygen filling the vacancies. By enabling the oxygen to move more easily, the required switching power may be reduced. A phase transition in the crystal orientation of the metal oxide to a cubic fluorite phase may induce the desired phase transition.

In particular, a doped metal oxide replaces the metal atoms in the lattice, and forms a cubic fluorite phase lattice even at room temperature (300 K or 80° F.) so that switching power may be reduced. For oxides with the cubic fluorite structure, the structure is formed by face-centered cubic (fcc) close packing of the metal cations and all tetrahedral interstices filled by oxygen anions. Some oxides exists in three polymorphs: monoclinic (m), tetragonal (t), and cubic (c). The crystal structures of the monoclinic and tetragonal phases are distorted derivatives of the fluorite structure, while the cubic phase has the fluorite structure. The cubic fluorite lattice has very high oxygen conductivity, so that less power is needed to move oxygen. As a result, switching power is reduced.

A crystal in the monoclinic state is described by three vectors of unequal length which form a rectangular prism with a parallelogram as its base. Two pairs of vectors are perpendicular, while the third pair makes an angle other than 90°. A crystal in the tetragonal state results from stretching a cubic lattice along one of its lattice vectors, so that the cube becomes a rectangular prism with a square base with equal lengths, L1×L1, and height, H≠L1. A crystal in the cubic state has a unit cell in the shape of a cube.

Furthermore, reliability is improved since the cubic fluorite phase is formed at room temperature. In this case, there is no phase transformation or volume change upon heating, so that temperature stability is increased. In contrast, if the monoclinic phase were to exist at room temperature, during operation of the resistance-switching memory element, when high temperatures are reached, a phase change from monoclinic to tetragonal could occur. In fact, significant heating can occur with current densities as high as $1 \times 10^7$ A/cm$^2$ (amps per square centimeter) during operation of the memory device. A phase change from monoclinic to tetragonal could cause volume changes in the resistance-switching memory element, leading to poor reliability.

In an example implementation, the metal oxide resistance-switching material may be Hafnium Oxide (HfO$_x$), and the dopant can be Yttrium (Y) at a concentration of 10%, 15% or more. In this case, the Yttitum-doped HfO$_x$ replaces the Hf atoms in the lattice. HfO$_x$ exists in the monoclinic state at room temperature, but changes into a tetragonal state at about 1700° C. and into the cubic state at about 2600° C.

Moreover, Yttrium is a large cation, larger than other cations such as Aluminum (Al). An ion is an atom or molecule in which the total number of electrons is not equal to the total number of protons, giving it a net positive or negative electrical charge. A cation is an ion with more protons than electrons, giving it a positive charge. By doping a tetravalent element (valence=4) such as Hafnium with a trivalent (valence=3) element such as Y, the two atoms can bond and share seven valence electrons, resulting in a vacancy which facilitates oxygen transport.

As an alternative to Yttrium, other candidate dopants which are sufficiently large to cause the cubic fluorite phase to form at room temperature include Magnesium (Mg), divalent valence=+2) Chromium (Cr), Calcium (Ca) and Scandium (Sc), and virtually any of the rare earth metals. These dopants can be divalent or trivalent, and have a large radius such as 70-80 picometers or greater. Magnesium has a radius of 72 pm. Chromium has a high spin radius of 80 pm and a low spin radius of 73 pm. Calcium has a radius of 100 pm. Scandium has a radius of 74.5 pm. Yttrium has a radius of 90 pm. These radius values are effective radii defined with respect to an ionic radius for $O^{-2}$ of 126 pm. It is also possible to define the radius using Pauling's reference for the ionic radius for $O^{-2}$ of 140 pm.

Other alternatives include the lanthanoids Praesodymium (Pr) (radius of 99 pm with valence +3; radius of 85 pm with valence +4), Neodymium (Nd) (radius of 129 pm with valence +2; radius of 98.3 pm with valence +3), Samarium (Sm) (radius of 122 pm with valence +2; radius of 95.8 pm with valence +3), Europium (Eu) (radius of 117 pm with valence +2; radius of 94.7 pm with valence +3), Gadolinium (Gd) (radius of 93.8 pm with valence +3) and Terbium (Tb) (radius of 92.3 pm with valence +3; radius of 76 pm with valence +4).

Further, the dopant is provided at a relatively high concentration such as 10%, 15%, 20% or up to 25% or greater. The concentration is the ratio of the number of dopant atoms to the number of atoms of the material. For example, a concentration of 10% represents 10 dopant atoms (e.g., Y) for every 100 atoms of the doped material (e.g., HfO$_x$). An increased concentration of the dopant should correlate with an increased ability to induce the phase transition because it results in a higher oxygen vacancy mobility. If the dopant concentration is too high, however, the ability of the resistance-switching material to retain its data state may be reduced. The optimum dopant concentration can be determined by experimentation based on the particular dopant and metal oxide which are used.

In a memory array of resistance-switching memory elements, each resistance-switching memory element may be pillar-shaped, extending between first and second electrodes and being in series with a steering element such as a diode. In a method for forming the resistance-switching memory element, the metal oxide layer such as HfO$_x$ may be deposited while being doped. That is, the metal oxide and the dopant are deposited concurrently, at least in part. Or, using atomic layer deposition, an oxide of a first metal such as HfO$_x$ can be deposited, followed sequentially by depositing an oxide of a second metal such as YO$_{1.5}$, followed by annealing to cause intermixing of these species. This deposition and annealing process is then repeated in successive cycles to build up the metal oxide layer. The resulting resistance-switching material comprises a metal oxide with a dopant as an additive. Generally, a compound is not formed by the metal oxide and the dopant. A dopant is meant to denote an added material (an additive) which is present in the metal oxide in a smaller concentration than the metal oxide, regardless of how the dopant is added to the metal oxide. A metal oxide is a molecular compound containing at least one oxygen atom as well as at least one metal atom.

Advantages may also be achieved by using specific contact materials for the metal oxide resistance-switching material, such as an n+ silicon layer on one side and, on the opposite side, a titanium (T) layer, a titanium oxide (TiOx) layer, a titanium nitride (TiN) layer, or a carbon (C) layer.

The resistance-switching memory element may be provided in a memory device which is described below.

FIG. 1 is a simplified perspective view of one embodiment of a memory cell 100 which includes a resistance-switching memory element 102 coupled in series with a steering element 104 between a first conductor 106 and a second conductor 108.

Resistance-switching memory element 102 includes a resistance-switching material or layer 130 having a resistivity that may be reversibly switched between two or more states. For example, the reversible resistance-switching material may be in an initial high-resistivity state upon fabrication that is switchable to a low-resistivity state upon application of a first voltage and/or current. Application of a second voltage and/or current may return the reversible resistance-switching material to the high-resistivity state. Alternatively, the resistance-switching memory element may be in an initial low-resistance state upon fabrication that is reversibly switchable to a high-resistance state upon application of the appropriate voltage(s) and/or current(s). When used in a memory cell, one resistance state may represent a binary "0" while another resistance state may represent a binary "1." However, more than two data/resistance states may be used. Numerous reversible resistance-switching materials and operation of memory cells employing reversible resistance-switching materials are described, for example, in the above-mentioned U.S. Patent Application Publication 2006/0250836.

In one embodiment, the process of switching the resistance from the high-resistivity state to the low-resistivity state is referred to as setting the resistance-switching memory element 102. The process of switching the resistance from the low-resistivity state to the high-resistivity state is referred to as resetting the resistance-switching memory element 102. The high-resistivity state is associated with binary data "0" and the low-resistivity state is associated with binary data "1." In other embodiments, setting and resetting and/or the data encoding can be reversed. The set or reset process can be performed for a memory cell to program it to a desired state to represent binary data.

In some embodiments, reversible resistance-switching material 130 may be formed from a metal oxide. Various different metal oxides can be used. In one example, hafnium oxide ($HfO_2$) is be used.

More information about fabricating a memory cell using reversible resistance-switching material can be found in US 2009/0001343, published Jan. 1, 2009, titled "Memory Cell That Employs a Selectively Deposited Reversible Resistance Switching Element and Methods of Forming The Same," and incorporated herein by reference in its entirety.

Resistance-switching memory element 102 includes electrodes 132 and 134. Electrode 132 is positioned between a reversible resistance-switching material 130 (such as metal oxide) and conductor 108. In one embodiment, electrode 132 is made of titanium (Ti). Electrode 134 is positioned between metal oxide reversible resistance-switching material 130 and diode 104. In one embodiment, electrode 134 is made of Titanium Nitride (TiN), and serves as a barrier layer.

Steering element 104 can be a diode, or other suitable steering element that exhibits non-ohmic conduction by selectively limiting the voltage across and/or the current flow through the resistance-switching memory element 102. In this manner, the memory cell 100 may be used as part of a two or three dimensional memory array and data may be written to and/or read from the memory cell 100 without affecting the state of other memory cells in the array. Diode 104 may include any suitable diode such as a vertical polycrystalline p-n or p-i-n diode, whether upward pointing with an n-region above a p-region of the diode or downward pointing with a p-region above an n-region of the diode. Or, even a punch-through diode, which is operable in both directions, can be used.

In some embodiments, diode 104 may be formed from a polycrystalline semiconductor material such as polysilicon, a polycrystalline silicon-germanium alloy, polygermanium or any other suitable material. For example, the diode 104 may include a heavily doped n+ polysilicon region 142, a lightly doped or an intrinsic (unintentionally doped) polysilicon region 144 above the n+ polysilicon region 142, and a heavily doped p+ polysilicon region 146 above the intrinsic region 144. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 142 to prevent and/or reduce dopant migration from the n+ polysilicon region 142 into the intrinsic region 144, as described, for example, in U.S. Patent Application Publication No. 2006/0087005, filed Dec. 9, 2005 and titled "Deposited Semiconductor Structure To Minimize N-Type Dopant Diffusion And Method Of Making," incorporated herein by reference. It will be understood that the locations of the n+ and p+ regions may be reversed.

When diode 104 is fabricated from deposited silicon (e.g., amorphous or polycrystalline), a silicide layer may be formed on the diode to place the deposited silicon in a low resistivity state, as fabricated. Such a low resistivity state allows for easier programming of the memory cell as a large voltage is not required to switch the deposited silicon to a low resistivity state.

As described in U.S. Pat. No. 7,176,064, "Memory Cell Comprising a Semiconductor Junction Diode Crystallized Adjacent to a Silicide," incorporated herein by reference, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistivity silicon thereby is provided. Similar results may be achieved for silicon-germanium alloy and/or germanium diodes.

Conductors 106 and 108 include any suitable conductive material such as tungsten, any appropriate metal, heavily doped semiconductor material, a conductive silicide, a conductive silicide-germanide, a conductive germanide, or the like. In the embodiment of FIG. 1, conductors 106 and 108 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 106 and 108 to improve device performance and/or aid in device fabrication.

While the resistance-switching memory element 102 is shown as being positioned above the steering element 104 in FIG. 1, it will be understood that in alternative embodiments, the resistance-switching memory element 102 may be positioned below the steering element 104.

FIG. 2A is a simplified perspective view of a portion of a first memory level 114 formed from a plurality of the memory cells 100 of FIG. 1. For simplicity, the resistance-switching memory element 102, the diode 104, and barrier layer 113 are not separately shown. The memory array 114 is a "cross-point" array including a plurality of bit lines (second conductors 108) and word lines (first conductors 106) to which multiple memory cells are coupled (as shown). Other memory array configurations may be used, as may multiple levels of memory.

Figure 3:
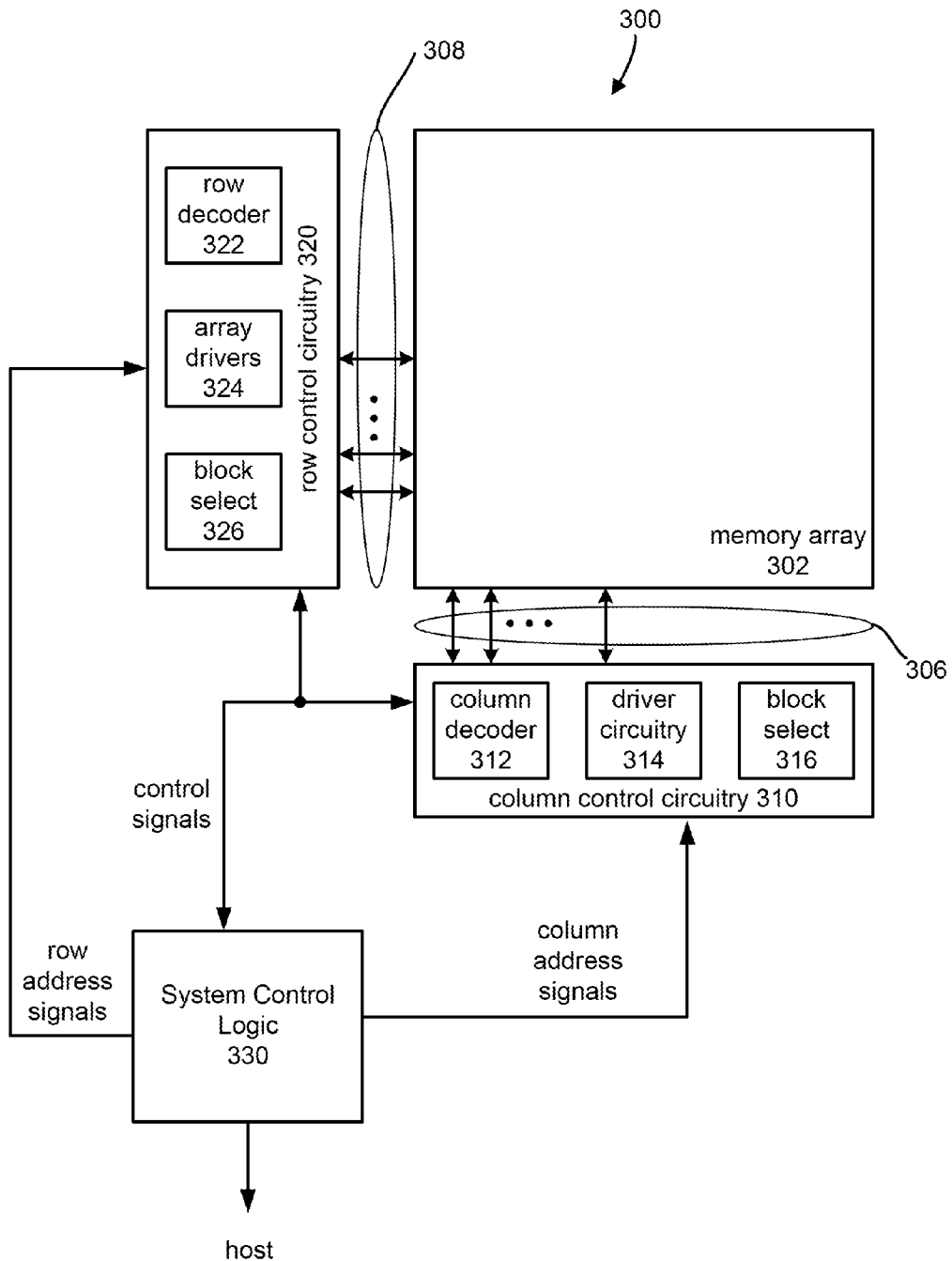
FIG. 3 is a block diagram of one embodiment of a memory system.

FIG. 2B is a simplified perspective view of a portion of a monolithic three dimensional array 116 that includes a first memory level 118 positioned below a second memory level 120. In the embodiment of FIG. 3, each memory level 118 and 120 includes a plurality of memory cells 100 in a cross-point array. It will be understood that additional layers (e.g., an inter-level dielectric) may be present between the first and second memory levels 118 and 120, but are not shown in FIG. 2B for simplicity. Other memory array configurations may be used, as may additional levels of memory. In the embodiment of FIG. 2B, all diodes may "point" in the same direction, such as upward or downward depending on whether p-i-n diodes having a p-doped region on the bottom or top of the diode are employed, simplifying diode fabrication.

Figure 2C:
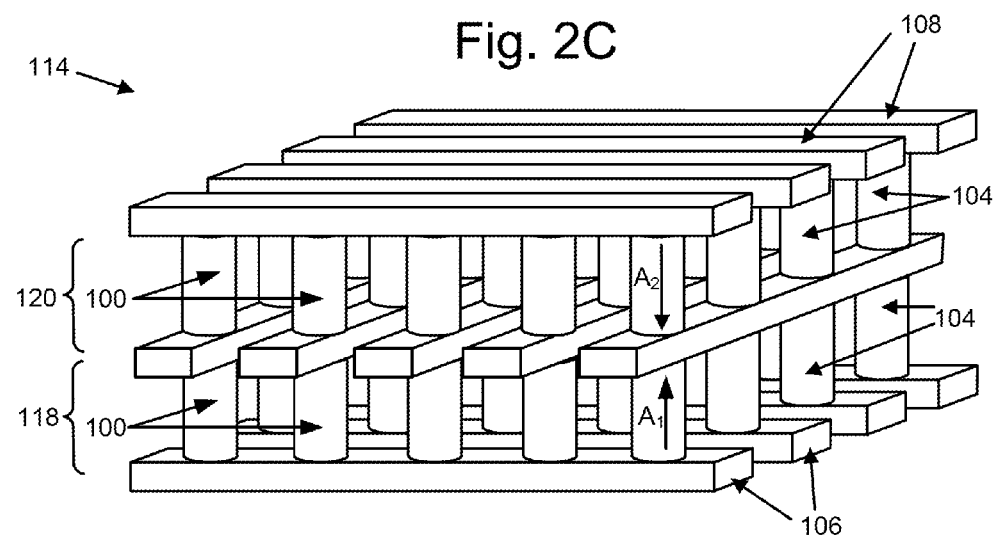
FIG. 2C is a simplified perspective view of a portion of a three dimensional memory array formed from a plurality of the memory cells of FIG. 1.

In some embodiments, the memory levels may be formed as described in U.S. Pat. No. 6,952,030, "High-Density Three-Dimensional Memory Cell," incorporated herein by reference. For instance, the upper conductors of a first memory level may be used as the lower conductors of a second memory level that is positioned above the first memory level as shown in FIG. 2C. In such embodiments, the diodes on adjacent memory levels preferably point in opposite directions, as described in U.S. Pat. No. 7,586,773, titled "Large Array Of Upward Pointing P-I-N Diodes Having Large And Uniform Current," incorporated herein by reference. For example, the diodes of the first memory level 118 may be upward pointing diodes as indicated by arrow A1 (e.g., with p regions at the bottom of the diodes), while the diodes of the second memory level 120 may be downward pointing diodes as indicated by arrow A2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory," incorporated herein by reference The substrates may be thinned or removed from the memory levels before bonding, but as the memory levels are initially formed over separate substrates, such memories are not true monolithic three dimensional memory arrays.

The above examples show memory cells in a cylindrical shape and conductors in the shapes of rails according to the disclosed arrangements. However, the technology described herein is not limited to any one specific structure for a memory cell. Other structures can also be used to form memory cells that include reversible resistance-switching material. For example, the following patents provide examples of structures of memory cells that can be adapted to use reversible resistance-switching material: U.S. Pat. Nos. 6,952,043; 6,951,780; 6,034,882; 6,420,215; 6,525,953; and 7,081,377, each of which is incorporated herein by reference. Additionally, other types of memory cells can also be used with the technologies described herein.

FIG. 3 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from system control logic circuit 330, and typically may include such circuits as row decoders 322, array terminal drivers 324, and block select circuitry 326 for both read and programming (e.g., set and reset) operations. Memory system 300 also includes column control circuitry 310 whose input/outputs 306 are connected to respective bit lines of the memory array 302. Column control circuitry 306 receives a group of N column address signals and one or more various control signals from system control logic 330, and typically may include such circuits as column decoders 312, array terminal receivers or drivers 314, block select circuitry 316, as well as read/write circuitry, including sense amps 318, and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300. For example, write circuitry 460, read circuitry 461 and clamp control circuitry 464, discussed further below, may be provided.

In one embodiment, all of the components depicted in FIG. 3 are arranged on a single integrated circuit. For example, system control logic 330, column control circuitry 310 and row control circuitry 320 can be formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

As described above, resistance-switching memory element 102 may be reversibly switched between two or more states. For example, the reversible resistance-switching material may be in an initial, high-resistivity state upon fabrication that is switchable to a low-resistivity state upon application of a first voltage and/or current. Application of a second voltage and/or current may return the reversible resistance-switching material to a high-resistivity state.

Figure 5A:
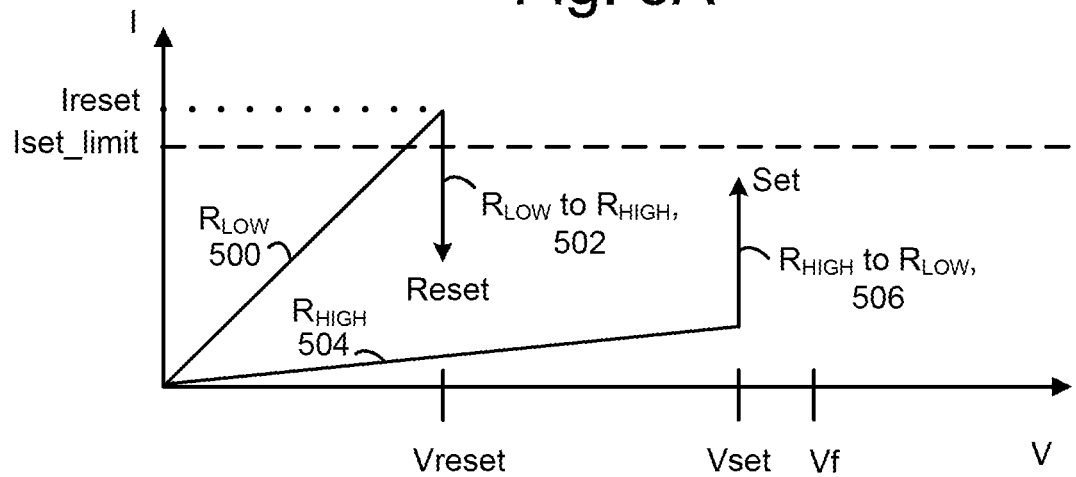
FIG. 5A is a graph depicting I-V characteristics of an example resistance-switching memory element.

FIG. 5A is a graph of voltage versus current for one example embodiment of a reversible resistance-switching element. Line 504 represents the I-V characteristics of the resistance-switching memory element when in the high-resistivity state ($R_{HIGH}$), and line 506 represents a transition to a low resistivity state at Vreset. Line 500 represents the I-V characteristics of the resistance-switching memory element when in the low-resistivity state ($R_{LOW}$), and line 502 represents a transition to a high resistivity state at Vset. The example shows an unipolar operation mode where the polarity of the voltage is not changed during switching. In general, the voltages may have different polarities for the "set" and "reset" operation.

To determine which state the resistance-switching memory element is in, a voltage is applied and the resulting current is measured. A higher measured current indicates that the resistance-switching memory element is in the low-resistivity state, while a lower measured current indicates that the resistance-switching memory element is in the high-resistivity state. Note that other variations of a resistance-switching memory element having different I-V characteristics can also be used with the technology herein.

Figure 5B:
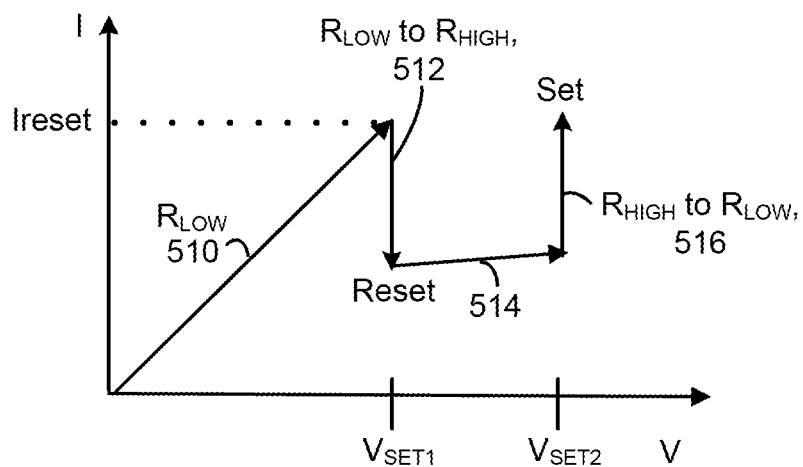
FIG. 5B is a graph depicting I-V characteristics of another example reversible resistance-switching element.

For example, FIG. 5B is a graph depicting I-V characteristics of another example reversible resistance-switching element. In this case, the element follows a path 510 in a low-resistivity state ($R_{LOW}$), then switches in path 512 to a high resistivity state at a voltage Vset1. As the voltage is increased further, the element follows a path 514 in the high-resistivity state ($R_{HIGH}$), then switches in path 516 to back to the low resistivity state at a voltage Vset2.

Figure 4:
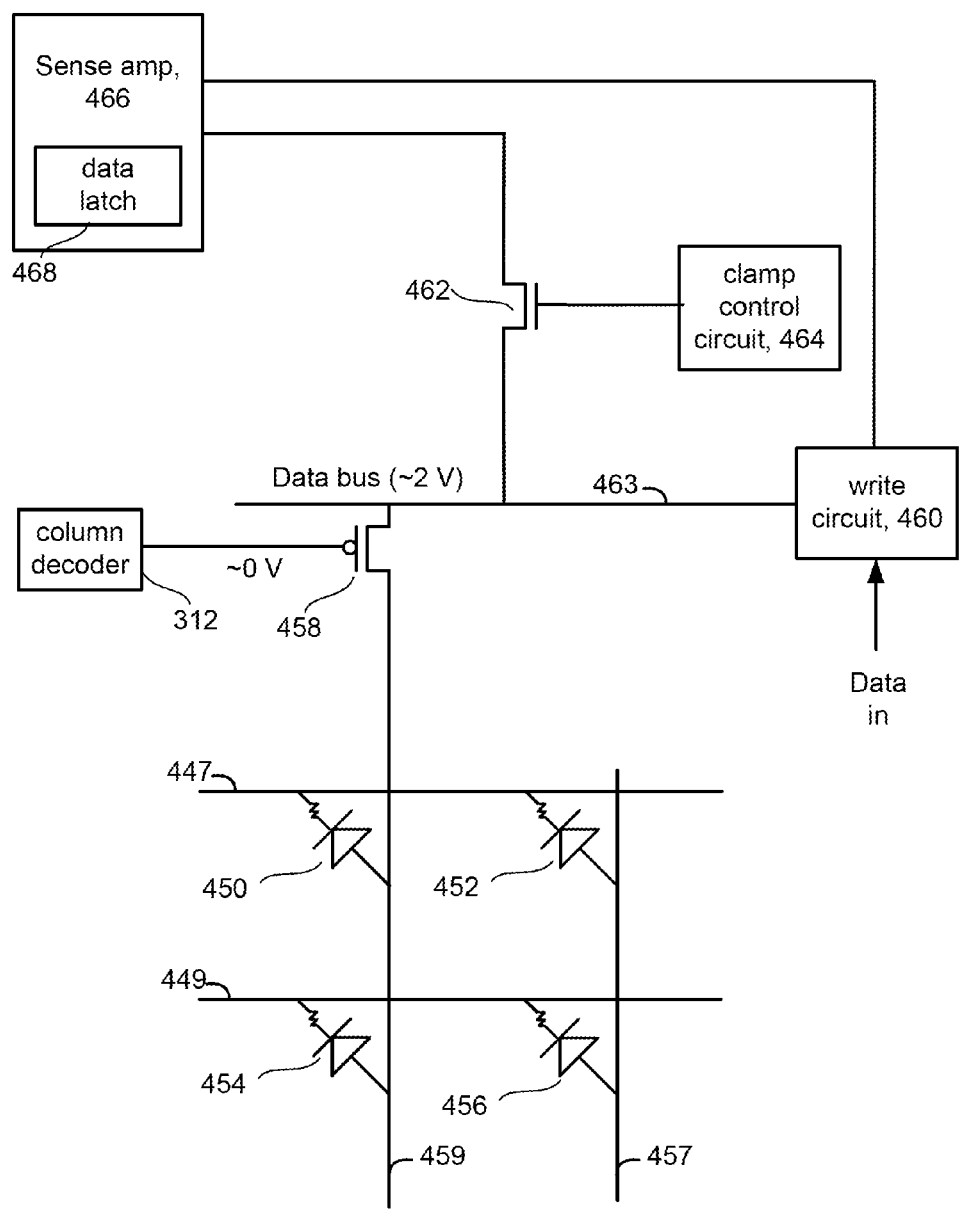
FIG. 4 depicts a circuit for reading the state of a memory cell.

FIG. 4 depicts a circuit that illustrates one embodiment for reading the state of a memory cell. A portion of a memory array includes memory cells 450, 452, 454 and 456. Two of the many bit lines and two of the many word lines are depicted. Bit line 459 is coupled to cells 450 and 454, and bit line 457 is coupled to cells 452 and 456. Bit line 459 is the selected bit line and may be at 2 V, for instance. Bit line 457 is an unselected bit line and may be at ground, for instance. Word line 447 is the selected word line and may be at 0 V, for instance. Word line 449 is an unselected word line and may be at 2 V, for instance.

A read circuit for one of the bit lines 459 is depicted to be connected to the bit line via transistor 458, which is controlled by a gate voltage supplied by column decoder 312 in order to select or unselect the corresponding bit line. Transistor 458 connects the bit line to a Data bus 463. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to a sense amp 466, which includes a data latch 468. The output of sense amp 466 is connected to a data out terminal (to system control logic 330, a controller and/or a host). Write circuit 460 is also connected to the sense amp 466 and the data latch 468.

When attempting to read the state of the reversible resistance-switching element, all word lines are first biased at $V_{READ}$ (e.g., approximately 2 V) and all bit lines are at ground. The selected word line is then pulled to ground. For example, this discussion will assume that memory cell 450 is selected for reading. One or more selected bit lines 459 are pulled to $V_{READ}$ through the data bus (by turning on transistor 458) and the clamp device (transistor 462, which receives ~2 $V+V_{TH}$, the threshold voltage of the transistor 462). The clamp device's gate is above $V_{READ}$ but controlled to keep the bit line near $V_{READ}$. In one approach, current is pulled by the selected memory cell 450 through transistor 462 from a sense node in the sense amp. The sense node can receive a reference current that is between a high-resistivity state current and a low-resistivity state current. The sense node moves correspondingly to the current difference between the cell current and the reference current. Sense amp 466 generates a data out signal by comparing the sensed voltage to a reference read voltage. If the memory cell current is larger than the reference current, the memory cell is in the low-resistivity state and the voltage at the sense node will be lower than the reference voltage. If the memory cell current is smaller than the reference current, the memory cell is in the high-resistivity state and the voltage at the sense node will be higher than the reference voltage. The output data signal from the sense amp 466 is latched in data latch 468.

Looking back at FIG. 5A, while in the high-resistivity state, if the voltage $V_{SET}$ and sufficient current is applied, the resistance-switching memory element will be set to the low-resistivity state. Line 504 shows the behavior when $V_{SET}$ is applied. The voltage will remain somewhat constant and the current will increase toward $I_{SET\_LIMIT}$. At some point, the resistance-switching memory element will be set and the device behavior will be based on line 506. Note that the first time the resistance-switching memory element is set, Vf (the forming voltage) is needed to set the device. After that, $V_{SET}$ is sufficient to set the device be used. The forming voltage Vf may be greater than $V_{SET}$.

While in the low-resistivity state (line 500), if the voltage $V_{RESET}$ and sufficient current ($I_{RESET}$) are applied, the resistance-switching memory element will be reset to the high-resistivity state. Line 500 shows the behavior when $V_{RESET}$ is applied. At some point, the resistance-switching memory element will be reset and the device behavior will be based on line 502.

In one embodiment, $V_{SET}$ is approximately 5 V, $V_{RESET}$ is approximately 3 V, $I_{SET\_LIMIT}$ is approximately 5 μA and $I_{RESET}$ could be as high as 30 μA.

Figure 6A:
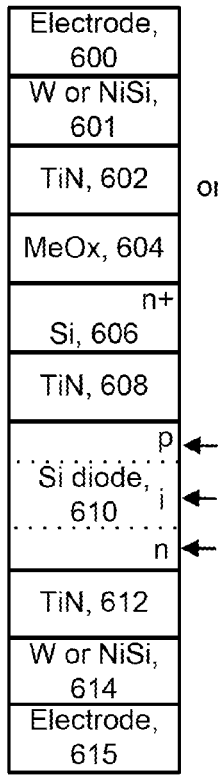
FIG. 6A depicts an example implementation of a layered memory device.

FIG. 6A depicts an example implementation of a layered memory device. The implementation includes a number of layers, each fabricated over the previous layer, including a W or NiSi layer 614 connected to a word line, a TiN layer 612, an Si diode 610 having an n-type region 613, an intrinsic (i) region 611 and a p-type region 609, a TiN layer 608, an n+ type Si layer 606, a MeOx layer 604, a TiN layer 602 and a W or NiSi layer 601 connected to a bit line. A portion of the word line which contacts the bottom of the layered memory device is an electrode 615, and a portion of the word line which contacts the top of the layered memory device is an electrode 600.

As mentioned at the outset, advantages may also be achieved by using specific contact materials for the metal oxide layer 604, which is a resistance-switching material as described herein. For example, the metal oxide can have an n+ silicon layer (e.g., layer 606) on one side and, on the opposite side, a titanium nitride layer (e.g., layer 602), a titanium oxide layer, a carbon layer or a titanium layer. Another option for the opposite side is Platinum (Pt), which is useful because it is inert and does not react with oxygen. It can therefore efficiently attach to and release oxygen. TiN and C have similar advantages as Pt and are useful as substitutes to Pt, which can be harder to integrate into the memory element due to difficulty in etching. The n+ silicon layer 606 provides a good contact generally to the metal oxide. The metal oxide can be $HfO_x$, as an example. The Si diode 610 is a steering element which allows a voltage to be selectively applied by a control to the MeOx layer 604.

Figure 6C:
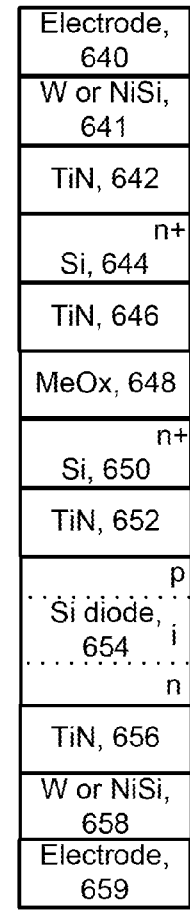
FIG. 6C depicts another example implementation of a layered memory device.
Figure 6B:
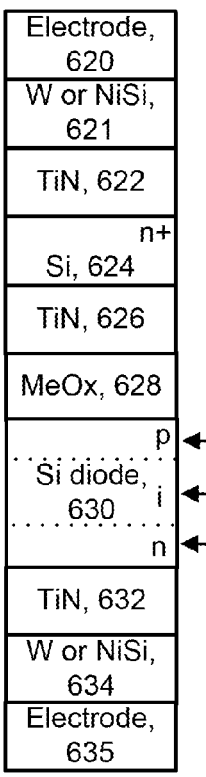
FIG. 6B depicts another example implementation of a layered memory device.

FIG. 6B depicts another example implementation of a layered memory device. The implementation includes a number of layers, each fabricated over the previous layer, including a W or NiSi layer 634 connected to a word line as represented by an electrode 635, a TiN layer 632, an Si diode 630 having an n-type region 633, an intrinsic (i) region 631 and a p-type region 629, a MeOx layer 628, a TiN layer 626, an n+ Si layer 624, a TiN layer 622 and a W or NiSi layer 621 connected to a bit line as represented by an electrode 620. In this case, the p-type region 629 of the Si diode contacts the MeOx layer 628, acting as an electrode.

FIG. 6C depicts another example implementation of a layered memory device. The implementation includes a number of layers, each fabricated over the previous layer, including a W or NiSi layer 658 connected to a word line as represented by an electrode 659, a TiN layer 656, an Si diode 654 having an n-type region 657, an intrinsic (i) region 655 and a p-type region 653, a TiN layer 652, an n+ type Si layer 650, a MeOx layer 648, a TiN layer 646, another n+ Si layer 644, a TiN layer 642 and a W or NiSi layer 641 connected to a bit line as represented by an electrode 640.

Figure 6D:
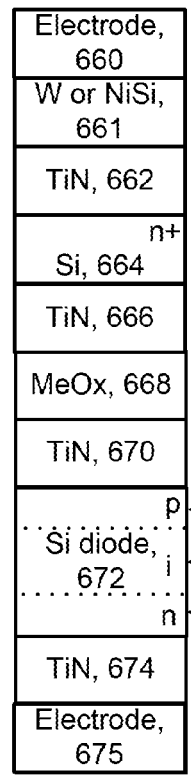
FIG. 6D depicts another example implementation of a layered memory device.

FIG. 6D depicts another example implementation of a layered memory device. The implementation includes a number of layers, each fabricated over the previous layer, including a TiN layer 674 connected to a word line as represented by an electrode 675, an Si diode 672 having an n-type region 675, an intrinsic (i) region 673 and a p-type region 671, a TiN layer 670, a MeOx layer 668, a TiN layer 666, an n+ Si layer 664, a TiN layer 662 and a W or NiSi layer 661 connected to a bit line as represented by an electrode 660. Here, the TiN layers 666 and 670 are both adjacent to the MeOx layer 668, on opposing sides, and act as metal contacts to the MeOx layer 668.

FIG. 6E depicts an example implementation of a layered memory device, where a punch-through diode is used as a steering element. The implementation is similar to that of FIG. 6B, except the Si diode 690 is a punch-through diode which includes an n+ region 693, p− region 691 and n+ region 689. The implementation includes a number of layers, each fabricated over the previous layer, including a W or NiSi layer 694 connected to a word line as represented by an electrode 695, a TiN layer 692, the Si diode 690, a MeOx layer 688, a TiN layer 686, an n+ Si layer 684, a TiN layer 682 and a W or NiSi layer 681 connected to a bit line as represented by an electrode 680.

A punch-through diode allows bipolar operation of a cross-point memory array, and may have a symmetrical non-linear current/voltage relationship. The punch-through diode has a high current at high bias for selected cells and a low leakage current at low bias for unselected cells. Therefore, it is compatible with bipolar switching in cross-point memory arrays having resistive switching elements. The punch-through diode may be a N+/P−/N+ device or a P+/N−/P+ device.

Generally, the punch-through diode 680 includes two regions 689 and 693 that are heavily-doped with a material having a first type of conductivity, e.g., n type. A region 691 is lightly-doped with a material having a second type of conductivity, e.g., p type. The punch-through diode 690 is a N+/P−/N+ device.

While example implementations involving a memory cell having a diode as a steering element are provided, the techniques provided herein are generally applicable to other devices and steering elements, including a transistor, a punch-through transistor, a punch-through diode, a PN diode, NP diode, a PIN diode, an NPN diode, PNP diode, a Schottky diode, an MIN diode, a carbon silicone diode, a transistor layout and so forth. An example of a punch-through diode was provided in FIG. 6E.

Variations of the above-mentioned implementations are possible. The order of layers in each implementation can be reversed so that the word line is on top and the bit line is on the bottom, for instance. Moreover, one or more intermediate layers can be provided between each of the layers depicted. Also, the order of the steering element can be changed so that it is located above the other layers.

FIG. 7 depicts an example method for fabricating a set of non-volatile resistance-switching memory elements. Step 700 includes forming a first conductive layer on a substrate. Step 702 includes forming a steering element above the first conductive layer. Step 704 includes forming a metal oxide layer doped with a cation, with a specified cation size and concentration, above the steering element layer.

In one approach, step 704 includes, at step 706, in one or more repeated cycles, depositing a metal-oxide layer, depositing an oxide of a cation, and annealing the two layers to cause intermixing of the two in an intermixed layer. See FIGS. 8C and 8D for further details. The deposition may be performed by atomic layer deposition (ALD), for instance. As an example, an oxide of a first metal such as $HfO_x$ can be deposited, followed by depositing an oxide of a second metal such as $YO_{1.5}$, followed by annealing to cause intermixing of these species. Alternatively, in a cycle, the oxide of a second metal can be deposited before the oxide of the first metal. In another option, in one cycle, the oxide of a second metal is deposited before the oxide of the first metal, and in another cycle, the oxide of a first metal is deposited before the oxide of the second metal. This deposition and annealing process can be repeated in successive cycles to build up a metal oxide layer which is generally uniformly doped with the cation.

In another approach, step 704 includes, at step 708, depositing the metal oxide layer while deposition the cation, at least partly concurrently. Generally, either of step 706 or step 708 results in distributing the cations as a dopant generally uniformly in the metal oxide, as opposed to a surface treatment, for instance, where doping into the final metal oxide layer is only by surface diffusion. Step 710 includes forming a second conductive layer above the metal oxide layer. Step 712 includes etching to form pillar-shaped memory elements. Step 714 includes fabricating additional layers. For example, the pillar-shaped memory elements may be arranged in each level of a multi-level three-dimensional monolithic memory device.

Figure 8A:
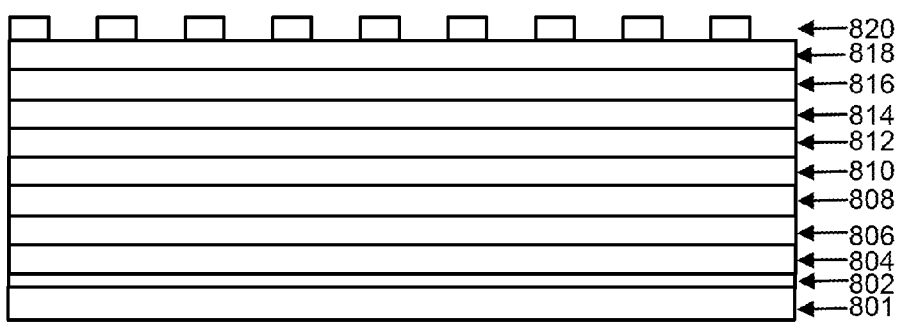
FIGS. 8A and 8B depict a cross-sectional view of example semiconductor structures used in the fabricating of FIG. 7.
Figure 8B:
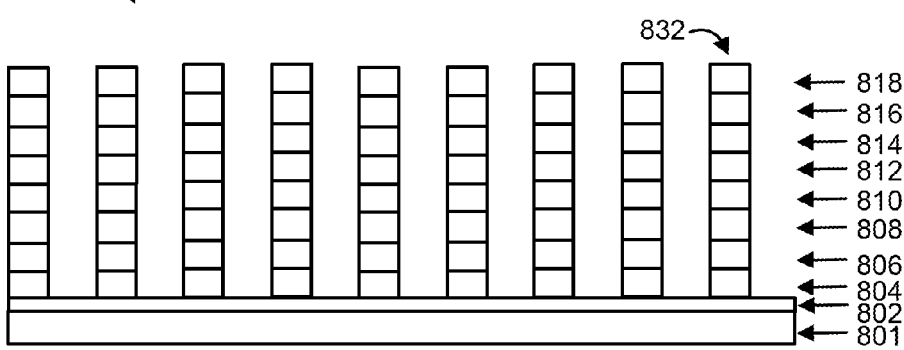

FIGS. 8A and 8B depict a cross-sectional view of example semiconductor structures used in the fabricating of FIG. 7. A high level overview is depicted. Also, note that the figures are not necessarily to scale. Furthermore, where a cross-sectional view is shown, it will be appreciated that the structure extends depth-wise as well, in three dimensions, such as to provide a planar area.

The structures correspond to the layered memory device of FIG. 6A. In FIG. 8A, the layered structure 800 includes a substrate 801, a conductive layer 802 which can provide a bottom electrode, a W or NiSi layer 804 (corresponding to layer 614 in FIG. 6A), a TiN layer 806 (corresponding to layer 612 in FIG. 6A), an Si diode layer 808 (corresponding to layer 610 in FIG. 6A), a TiN layer 810 (corresponding to layer 608 in FIG. 6A), an n+ type Si layer 812 (corresponding to layer 606 in FIG. 6A), a MeOx layer 814 (corresponding to layer 604 in FIG. 6A), a TiN layer 816 (corresponding to layer 602 in FIG. 6A) and a W or NiSi layer 818 (corresponding to layer 601 in FIG. 6A). Patterned photoresist regions 820 are also depicted. In one possible approach, a pattern of a photomask is transferred to the photoresist layer by selectively exposing the photoresist layer to UV light such as 193 nm (deep ultraviolet) light and removing the exposed portion of the photoresist using a developer.

FIG. 8B depicts a semiconductor structure 830 which is formed by etching the structure 800 of FIG. 8A and removing the photoresist. A number of pillar-shaped memory elements are formed, including example memory element 832. Note that the thickness of the metal oxide layer can be quite thin, such as 2-6 nm, 3-5 nm, or 2-30 nm.

Each non-volatile resistance-switching memory element includes a first, e.g., bottom, electrode at a first height above a substrate, a plurality of layers provided on the first electrode, and a second, e.g., top, electrode provided on the plurality of layers, at a second height above the substrate, and in series, electrically, with the plurality of layers. The plurality of layers is also in series, electrically, with the first electrode, and comprises a resistance-switching element, e.g., the doped metal oxide layer, and a steering element, e.g., a diode, in series with the resistance-switching element. The metal of the metal oxide layer is different than the metal of the cation used for doping.

The substrate 801 can be any semiconducting substrate as known in the art, such as monocrystalline silicon, IV-IV compounds such as silicon-germanium or silicon-germanium-carbon, III-V compounds, II-VII compounds, epitaxial layers over such substrates, or any other semiconducting material. The substrate may include integrated circuits fabricated therein. In some case, a reference to one layer being formed on another layer, or the like, as used herein may indicate that the one layer is in contact with the other layer, and that a bottom surface of the one layer is in contact with a top surface of the other layer.

Figure 8C:
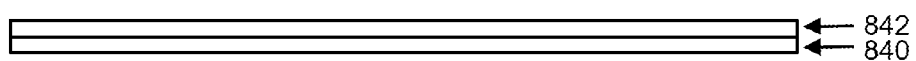
FIG. 8C depicts a metal oxide layer and an oxide of a cation layer, both deposited by atomic layer deposition.
Figure 8D:
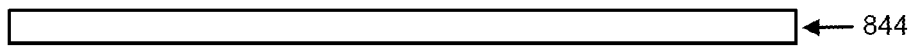
FIG. 8D depicts an intermixed layer formed by annealing the structure of FIG. 8C.

FIG. 8C depicts a metal oxide layer and an oxide of a cation layer, both deposited by atomic layer deposition. As mentioned in connection with step 706 of FIG. 7, one or more repeated cycles can be performed in which a layer with an oxide of a metal 840 is deposited, a layer with an oxide of a cation 842 is deposited, and annealing is performed to cause intermixing of the two in an intermixed layer 844 (FIG. 8D). FIG. 8D depicts an intermixed layer formed by annealing the structure of FIG. 8C.

In one aspect, a non-volatile resistance-switching memory element is provided. The memory element includes a first electrode at a first height above a substrate, multiple layers provided on the first electrode, and a second electrode provided on the multiple layers, at a second height above the substrate, and in series with the multiple layers. The multiple layers is in series with the first electrode, and comprises a resistance-switching element and a steering element in series with the resistance-switching element. The resistance-switching element comprises a metal oxide layer comprising an oxide of a first metal, where a cation of a second metal is a dopant in the oxide of the first metal, the second metal is different than the first metal, and the dopant is provided at a concentration of greater than 10%, and having an ionic radius of at least 70 picometers.

In another aspect, a set of resistance-switching memory elements is provided. It includes multiple first electrodes at a first height above a substrate, multiple second electrodes at a second height above the substrate, and multiple pillar-shaped memory elements. Each pillar-shaped memory element is between, and in series with, a respective first electrode and a respective second electrode, and comprises a resistance-switching element and a steering element in series with the resistance-switching element. The resistance-switching element comprises a metal oxide layer comprising an oxide of a first metal, where a cation of a second metal is a dopant in the oxide of the first metal, the second metal is different than the first metal, and the dopant is provided at a concentration of greater than 10%, and having an ionic radius of at least 70 picometers.

In another aspect, a method for fabricating a set of non-volatile resistance-switching memory elements is provided. The method includes forming a first conductor at a first height above a substrate, and depositing multiple layers on the first conductor, including providing a metal oxide layer comprising an oxide of a first metal, where a cation of a second metal is a dopant in the oxide of the first metal, the second metal is different than the first metal, and the dopant is provided at a concentration of greater than 10%, and having an ionic radius of at least 70 picometers. The method further includes etching the plurality of layers to form at least one pillar-shaped element above the first conductor, wherein the at least one pillar-shaped element comprises a steering element in series with a portion of the metal oxide layer, and where the portion of the metal oxide layer is a resistance-switching element. The method further includes forming a second conductor at a second height above the substrate, where the first and second conductors are in communication with at least one pillar-shaped element for controlling switching of the resistance-switching element.

The foregoing detailed description has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A non-volatile resistance-switching memory element, comprising:
    a first electrode at a first height above a substrate;
    a plurality of layers provided on the first electrode, the plurality of layers is in series with the first electrode, and comprises a resistance-switching element and a steering element in series with the resistance-switching element, the steering element comprising a diode, the resistance-switching element comprises a Hafnium oxide ($HfO_2$) layer, where a cation of a metal is a dopant in the $HfO_2$ layer, the dopant is provided at a concentration of greater than 10%, and the metal is one of Magnesium (Mg), Praesodymium (Pr), Neodymium (Nd), Samarium (Sm), Europium (Eu), Gadolinium (Gd), Terbium (Tb), Calcium (Ca), Scandium (Sc) or Yttrium (Y), and the plurality of layers further comprise an n+silicon layer contacting one side of the $HfO_2$ layer and a titanium, titanium oxide, titanium nitride or carbon layer contacting an opposite side of the $HfO_2$ layer; and
    a second electrode provided on the plurality of layers, at a second height above the substrate, and in series with the plurality of layers.

2. The non-volatile resistance-switching memory element of claim 1, wherein:
    the $HfO_2$ layer has a thickness of 2-30 nm.

3. The non-volatile resistance-switching memory element of claim 1, wherein:
    the $HfO_2$ layer is in a cubic fluorite phase at room temperature.

4. The non-volatile resistance-switching memory element of claim 1, wherein:
    the dopant is provided at a concentration of at least 15%.

5. The non-volatile resistance-switching memory element of claim 1, wherein:
    the dopant is provided at a concentration of at least 20%.

6. The non-volatile resistance-switching memory element of claim 1, wherein:
    the metal is Yttrium (Y) and is provided at a concentration of at least 15%.

7. The non-volatile resistance-switching memory element of claim 1, wherein:
    the metal is Yttrium (Y).

8. The non-volatile resistance-switching memory element of claim 1, wherein:
    in the plurality of layers, the $HfO_2$ layer is contacted by the titanium layer on the opposite side.

9. The non-volatile resistance-switching memory element of claim 1, wherein:

in the plurality of layers, the $HfO_2$ layer is contacted by the titanium oxide layer on the opposite side.

10. The non-volatile resistance-switching memory element of claim 1, wherein:
in the plurality of layers, the $HfO_2$ layer is contacted by the titanium nitride layer on the opposite side.

11. The non-volatile resistance-switching memory element of claim 1, wherein:
in the plurality of layers, the $HfO_2$ layer is contacted by the carbon layer on the opposite side.

12. A set of resistance-switching memory elements, comprising:
a plurality of first electrodes at a first height above a substrate;
a plurality of second electrodes at a second height above the substrate; and
a plurality of pillar-shaped memory elements, each pillar-shaped memory element is between, and in series with, a respective first electrode and a respective second electrode, and comprises:
a resistance-switching element and a steering element in series with the resistance-switching element, the steering element comprising a diode, the resistance-switching element comprises a Hafnium oxide ($HfO_2$) layer, where a cation of a metal is a dopant in the $HfO_2$ layer, the dopant is provided at a concentration of greater than 10%, and the metal is one of Magnesium (Mg), Praesodymium (Pr), Neodymium (Nd), Samarium (Sm), Europium (Eu), Gadolinium (Gd), Terbium (Tb), Calcium (Ca), Scandium (Sc) or Yttrium (Y);
an n+silicon layer contacting one side of the $HfO_2$ layer; and
a titanium, titanium oxide, titanium nitride or carbon layer contacting an opposite side of the $HfO_2$ layer.

13. The set of resistance-switching memory elements of claim 12, wherein:
the plurality of pillar-shaped memory elements are arranged in one level of a multi-level three-dimensional monolithic memory device.

14. The set of resistance-switching memory elements of claim 12, wherein:
the dopant is provided at a concentration of at least 15%.

15. The set of resistance-switching memory elements of claim 14, wherein:
the metal is Yttrium (Y).

16. The set of resistance-switching memory elements of claim 12, wherein:
the metal is Yttrium (Y) and is provided at a concentration of at least 15%.

17. A method for fabricating a non-volatile resistance-switching memory element, comprising:
providing a first electrode at a first height above a substrate;
providing a plurality of layers on the first electrode, the plurality of layers is in series with the first electrode, and comprises a resistance-switching element and a steering element in series with the resistance-switching element, the steering element comprising a diode, the resistance-switching element comprises a Hafnium oxide ($HfO_2$) layer, where a cation of a metal is a dopant in the $HfO_2$ layer, the dopant is provided at a concentration of greater than 10%, and the metal is one of Magnesium (Mg), Praesodymium (Pr), Neodymium (Nd), Samarium (Sm), Europium (Eu), Gadolinium (Gd), Terbium (Tb), Calcium (Ca), Scandium (Sc) or Yttrium (Y), and the plurality of layers further comprise an n+ silicon layer contacting one side of the $HfO_2$ layer and a titanium, titanium oxide, titanium nitride or carbon layer contacting an opposite side of the $HfO_2$ layer; and
providing a second electrode on the plurality of layers, at a second height above the substrate, and in series with the plurality of layers.

18. The method of claim 17, wherein:
the $HfO_2$ layer has a thickness of 2-30 nm.

19. The method of claim 17, wherein:
the dopant is provided at a concentration of at least 15%.

20. The method of claim 17, wherein:
the dopant is provided at a concentration of at least 20%.

* * * * *